US006587670B1

(12) United States Patent
Hoyt et al.

(10) Patent No.: US 6,587,670 B1
(45) Date of Patent: Jul. 1, 2003

(54) DUAL MODE CLASS D AMPLIFIERS

(75) Inventors: David Hoyt, Satellite Beach, FL (US); Stuart W. Pullen, Raleigh, NC (US); Patrick A. Begley, West Melbourne, FL (US); Arecio A. Hernandez, Melbourne, FL (US); Jeffrey M. Strang, Durham, NC (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/342,376

(22) Filed: Jun. 29, 1999

Related U.S. Application Data
(60) Provisional application No. 60/113,197, filed on Dec. 22, 1998.

(51) Int. Cl.[7] .................................................. H04B 1/10
(52) U.S. Cl. ........................................ 455/63; 455/71
(58) Field of Search .......................... 455/63, 66, 67.3, 455/61, 71, 553, 296, 311, 310; 330/149; 329/360

(56) References Cited

U.S. PATENT DOCUMENTS

| | | | | | |
|---|---|---|---|---|---|
| 3,816,664 A | * | 6/1974 | Koch | ........................ | 179/15.55 |
| 4,056,808 A | * | 11/1977 | Benhamou | .................. | 340/171 |
| 4,081,752 A | * | 3/1978 | Sumi | .......................... | 325/335 |
| 4,346,349 A | | 8/1982 | Yokoyama | | |
| 4,355,414 A | * | 10/1982 | Inoue | .......................... | 455/184 |
| 4,415,933 A | * | 11/1983 | Murayama et al. | ......... | 358/281 |
| 4,673,888 A | * | 6/1987 | Engehmann et al. | ......... | 330/10 |
| 4,952,884 A | | 8/1990 | Tokumo et al. | | |
| 5,519,889 A | * | 5/1996 | Hipp | .......................... | 455/296 |

FOREIGN PATENT DOCUMENTS

| | | |
|---|---|---|
| EP | 0 557 032 A2 | 8/1993 |
| EP | 0 557 032 A3 | 8/1993 |

OTHER PUBLICATIONS

International Search Report.

* cited by examiner

*Primary Examiner*—Lester G. Kincaid
*Assistant Examiner*—Naghmeh Mehrpour
(74) *Attorney, Agent, or Firm*—Laurence S. Roach, Esq.; Jaeckle Fleischmann & Mugel, LLP

(57) ABSTRACT

Pulse width modulated ("Class D") amplifiers and controllers switching in the 50 khz to 2 MHz range generate harmonics which interfere with AM radio reception. This has precluded wide spread acceptance of class D amplifiers in products with an AM radio. The amplifiers described here use a modified modulation technique when operating with an AM radio to avoid generating harmonics at the receiver selected frequency or its intermediate (IF) frequency. One embodiment uses a harmonic avoidance modulator. A second embodiment uses two or more oscillators and tests for the least distorted output signal. A third embodiment switches the mode of operation to a class AB amplifier when an AM signal is amplified.

2 Claims, 7 Drawing Sheets

DIGITAL WINDOW COMPARATOR CONTROLLER

ANALOG WINDOW COMPARATOR SOLUTION

MULTIPLE CLOCK CONTROLLER

DUAL MODE CLASS D AMPLIFIERS

This is a conversion of U.S. Provisional Application No. 60/113,197 filed Dec. 22, 1998.

This invention relates in general to class D amplifiers and in particular to class D amplifiers that have one or modes of operation for avoiding AM radio harmonic frequencies during operation.

BACKGROUND OF THE INVENTION

Class D power amplifiers are typically pulse-width modulated amplifiers that switch at frequencies well above the top of the audio band, often at frequencies of 100 kHz or greater. When a class D amplifier switches at these high frequencies, the switching frequency or its harmonics can interfere with AM radio receivers that are located close to the class D amplifier. Because of these interference problems, class D amplifiers cannot be easily integrated into consumer electronic products, such as stereo receivers, that have an AM tuner and power amplifier in the same chassis. Class D modulators switching in the 50 khz to 2 MHz range generate harmonics which interfere with AM radio reception. This has precluded wide spread acceptance of class D in products with an AM radio.

The AM radio broadcast band spans from 540 to 1700 kHz in the US and up to 30 MHz worldwide. To sample a 20 khz audio signal, class D modulators must run at frequencies greater than 200 khz. Because the output of these modulators is a pulse width modulated square wave, the modulators generate both even and odd harmonics. The low pass filter that removes the carrier from the speaker leads also attenuates these harmonics. However, it is not practical to design a filter with adequate high frequency attenuation and still pass 20 kHz audio signals without interfering with the sensitive AM receiver bandpass. Furthermore, the printed circuit board traces with the pulse width modulated square wave radiate. This radiation can be picked up directly by the AM antenna.

In theory the problem can be solved by ensuring the clock frequency of the class D modulator is much higher than the AM broadcast band. This however cannot be practically implemented for several reasons: 1) With a 2 MHz carrier the FETs must be switched by high current gate drivers. At the duty cycle extremes, the very short on and off times are not possible to achieve even with high gate drive. Thus, the theoretical power is limited. 2) The fast switching times will make it nearly impossible to achieve EMC compliance above 30 Mhz. 3) Unless all the clocks are synchronized in stereo and five channel applications, IMD products will be generated that will interfere with the AM band. 4) The body diodes of the MOSFETS with their long recovery time, cannot be used at this high frequency. Thus, a Shottky commutating diode is required. At bus voltages greater than 48 VDC, the forward drop of this diode may be higher than that of the body diode, and the body diode will have to be blocked with a drain diode. 5) The AM band in Europe extends to 30 Mhz.

SUMMARY

The invention provides circuits and methods for solving the problem of class D amplifier interference with the AM radio band. In its broader aspects the invention provides one or more reference standards for frequency. The AM radio's local oscillator signal, or the switching amplifier signal, or both, are compared to the standards. Suitable circuitry then modifies the switching amplifier signal to keep the switching amplifier signal far enough away from the tuned AM radio station and the local oscillator and thereby avoid the problem of interference. The invention provides means for monitoring the local oscillator and the switching signal and selecting a switching oscillator signal that has a frequency which is neither a harmonic of the local oscillator nor the tuned AM radio station. The invention either generates the switching signal from the local oscillator or selects another oscillator with a frequency that is not a harmonic of the local oscillator or tuned AM radio station.

The class D amplifier controlled by the divided local oscillator signal in each of these embodiments may be any suitable amplifier, including a self oscillating pulse width modulator with an integrator with feedback from the output of the amplifier and a comparator coupled to the output of the integrator. The output of the modulator is coupled to a bridge gate driver that controls the power to a MOSFET bridge circuit. The bridge circuit is connected between high and low voltage power busses and has at least two MOSFETs connected in series with each other. The class D amplifier under discussion must have a provision for external control of its switching frequency.

The local oscillator signal is present in all AM radios and is at a frequency of 450 or 455 kHz above the tuned radio station in radios designed to receive the US broadcast band. The local oscillator may be found at different offsets from the tuned station in other nations, but a circuit can be designed as long as the offset is known. The local oscillator can take any periodic form depending on the design of the tuner. Often the local oscillator is a sine wave created by a phase-locked loop circuit.

Those skilled in the art understand that the control concept described in the analog comparator embodiment can be implemented by using any of a very large number of physical products, including, but not limited to, digital devices such as Complex Programmable Logic Devices (CPLDs), Field Programmable Gate Arrays (FPGAs), microcontrollers, semi-custom or custom Application Specific Integrated Circuits (ASICs), and 74xxxx series integrated circuit logic gates. A large number of different analog devices, including resistors, capacitors, inductors, transistors, and field-effect transistors (FETs) may be combined in different ways to implement the analog portion of the algorithm presented here. Future technological advances may produce other physical devices capable of implementing the algorithm. Regardless of the products used for implementation of this algorithm, any implementation of the algorithm is covered in this patent.

Analog Comparators

One embodiment of the invention uses analog comparators and a digital counter. That embodiment takes a local oscillator signal from the AM tuner and uses it to intelligently determine a fixed operating frequency for a class D amplifier. The local oscillator is divided by an integer number N where 2<N<7 for the US AM broadcast band and the particular class D amplifier for which the system was devised. N varies between three and six inclusive throughout the range of local oscillator frequencies used in an AM tuner. N for any particular local oscillator frequency is chosen so that the frequency and its harmonics resulting from dividing the local oscillator frequency by N are as far as possible from the tuned radio station corresponding to the frequency of the local oscillator.

The analog comparator embodiment provides a method for determining the appropriate value of N based on a pre-determined algorithm. The method is comprised of a set of analog voltage comparators that control a digital divide-by-N circuit. The divide-by-N circuit divides the frequency of the AM local oscillator pulse train by the appropriate value of N.

Digital Comparators

Another embodiment of the invention relies upon a square wave input oscillator signal and a digital circuit for dividing the square wave to a non-interfering frequency. That embodiment takes a local oscillator signal from the AM tuner and uses it to intelligently determine a fixed operating frequency for a class D amplifier. The local oscillator is divided by an integer number N where 2<N<7 for the US AM broadcast band in the particular application of this control method presented here. N will vary from three to six throughout the range of local oscillator frequencies used in an AM tuner. N is chosen so that the frequency and its harmonics resulting from dividing the local oscillator frequency by N are as far as possible from the tuned radio station corresponding to the frequency of the local oscillator. Keeping the switching harmonics and fundamental away from the tuned radio station's frequency and the local oscillator prevents electromagnetic interference.

The digital comparator embodiment providing a method for determining the appropriate value of N is described in this document. The method is essentially a digital window comparator comprised of a counter and a latch that serves as an input to three digital magnitude comparators. The magnitude comparators instruct a divide-by-N circuit on the proper value of N by which to divide the local oscillator.

The class D amplifier under discussion must have a provision for external control of its switching frequency. Such an amplifier with an external input would be controlled by the algorithm described in this patent.

Two Loop

A third embodiment is a two loop digital comparator circuit. It takes a local oscillator signal from the AM tuner and uses it to intelligently determine a fixed operating frequency for a class D amplifier. The local oscillator is divided by an integer number N where, for the particular amplifier used, 2<N<7 for the US AM broadcast band. N varies throughout the range of local oscillator frequencies used in an AM tuner. N is chosen so that the frequency and its harmonics resulting from dividing the local oscillator frequency by N are as far as possible from the tuned radio station corresponding to the frequency of the local oscillator.

An algorithm for determining the appropriate value of N is described in this document. The algorithm is essentially a pair of frequency comparators that compare the local oscillator frequency with both a maximum frequency and a previously detected frequency. The frequency comparators instruct a divide-by-N circuit on the proper value of N by which to divide the local oscillator.

The class D amplifier under discussion must have a provision for external control of its switching frequency. Such an amplifier with an external input would be controlled by the algorithm described in this patent.

Selected Clocks

A fourth embodiment relies upon selecting one of a plurality of clocks or oscillators based upon a comparison of the local oscillator to the switching frequency of the class D amplifier. It provides a circuit and a method that prevents electromagnetic interference from class D amplifiers from interfering with AM radios located in the same chassis as the class D amplifiers. The method can be used in a variety of consumer electronic audio products such as AM/FM stereo receivers, portable "boom boxes," and personal stereos such as the Sony Walkman. An electronic controller has been developed that controls the switching frequency of a class D amplifier to prevent its switching fundamental and harmonics from interfering with the in-chassis AM radio.

The class D amplifier under discussion must have a provision for external control of its switching frequency. Such an amplifier with an external input would be controlled by the algorithm described in this patent.

DETAILED DESCRIPTION OF THE DRAWINGS

Advances in MOSFET technology as well as advances in integrated circuits have made it possible to apply class D amplifiers to audio applications. Class D amplifiers are significantly more efficient than class AB amplifiers. In the past, disadvantages of class D amplifiers included higher parts count, cost, electromagnetic interference, and poor performance. With increased integration and the introduction of sophisticated control integrated circuits these disadvantages are becoming less pronounced. In the near future, class D amplifiers will replace class AB amplifiers in many applications. Class D amplifiers already have a clear advantage in high power applications. As the cost and component count of these amplifiers fall, class D amplifiers will be able to complete with class AB amplifiers in low and medium power applications.

Figure 1:
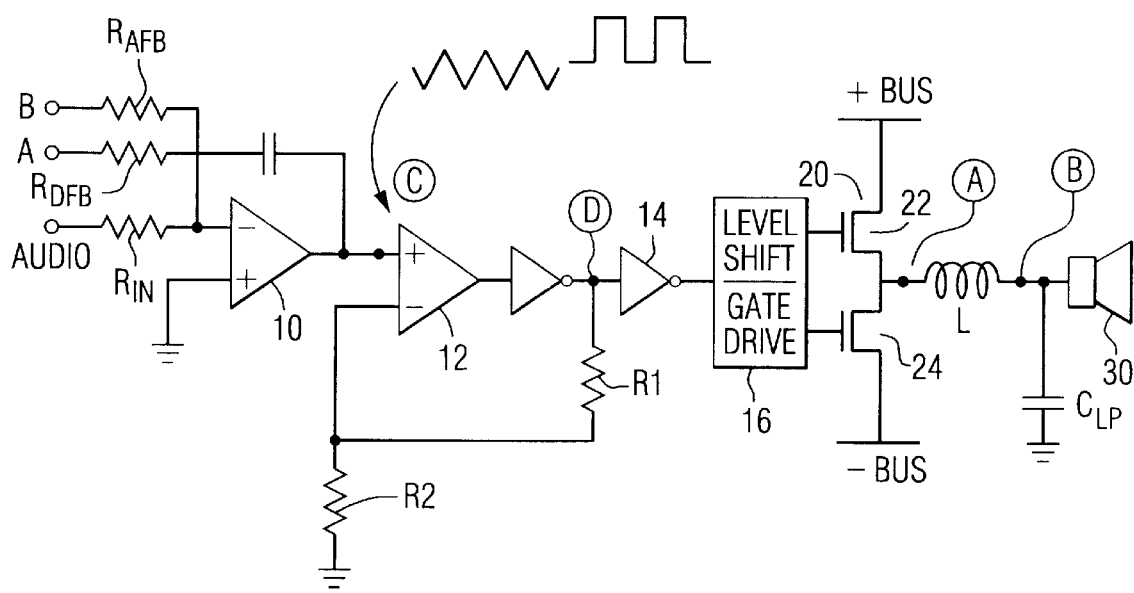
FIG. 1 is a schematic of a typical prior art class D amplifier.

To overcome the poor performance of class D amplifiers, others have suggested a self oscillating variable frequency modulator as shown in FIG. 1. An integrator 10 has an audio input over an input resistor $R_{IN}$. It has a digital feedback input A over resistor $R_{DFB}$, and an analog feedback at input B over resistor $R_{AFB}$. The respective analog and digital feedback signals A, B, are taken from the output of the bridge circuit 20 and the low-pass filter that comprises the inductor L and capacitor $C_{LP}$. For purposes of understanding, let us simply focus on the digital output A and assume that there is no audio input. In this case, the output at point A is a square wave with a 50% duty cycle. When the square wave is high, current flows through $R_{DFB}$ into the summing junction of the integrator 10. Its output ramps down until it reaches the negative threshold of the comparator 12. R1 and R2 are used to add hysteresis to the comparator 12. These resistors can be used to adjust the comparator positive and negative thresholds. When the output of the comparator 12 goes low, the upper FET 22 turns off and after a short delay the lower FET 24 turns on. The square wave goes low, and current now flows out of the integrator 10 summing junction through $R_{DFB}$. The output of the integrator 10 reverses and ramps up until it reaches the positive threshold of the comparator 12. This signals the lower FET 24 to turn off and after a short delay the upper FET 22 turns on. The square wave goes high and the cycle continues. With no audio signal, the output at A is a 50% square wave, and the output of the integrator 10 is a triangle wave.

Now consider the case when an audio signal is applied. Assuming that the audio signal is positive, then current flows through $R_{IN}$ into the integrator summing junction. Current also flows through $R_{AFB}$ out of the summing junction (negative feedback). The net contribution of the audio signal to the integrator summing junction current is $I_{RIN}-I_{RAFB}$. When the upper FET 22 is on, the currents $I_{DFB}$ and $(I_{RIN}-I_{RAFB})$ are both into the summing junction. This speeds up the ramp at the output of the integrator 10. When the lower FET 24 is on, the current through $I_{DFB}$ reverses and the two current now are in opposite directions. This slows the ramp down. A similar analysis can be applied to the case where the input signal is negative.

Since the hysteresis built into the comparator 12 is constant, the slope of the positive and negative ramps directly affects the positive and negative pulse widths, and therefore the duty cycle and frequency of the comparator output. At the higher positive audio input voltages, the audio output becomes negative and the on time of the high side switch becomes negligible compared to the on time period of the low side switch. The width of the low side pulse is roughly proportional to the output voltage and primarily sets the loop frequency.

Harmonic Avoidance Class D Amplifier

Sonic performance is very important in audio amplifiers. Audio class D amplifiers must have low THD, low noise, and a flat frequency response. These performance specifications conflict with the requirement that the amplifier must not interfere with AM radio. The solution is dual mode operation. When in an AM-compatibility mode, the amplifier must not interfere with AM radio reception. Since AM radio is band limited to 5 khz and the background noise is high, a slight degradation in performance is acceptable in most cases. Otherwise, the design goal is to optimize the sound for maximum fidelity.

Figure 2:
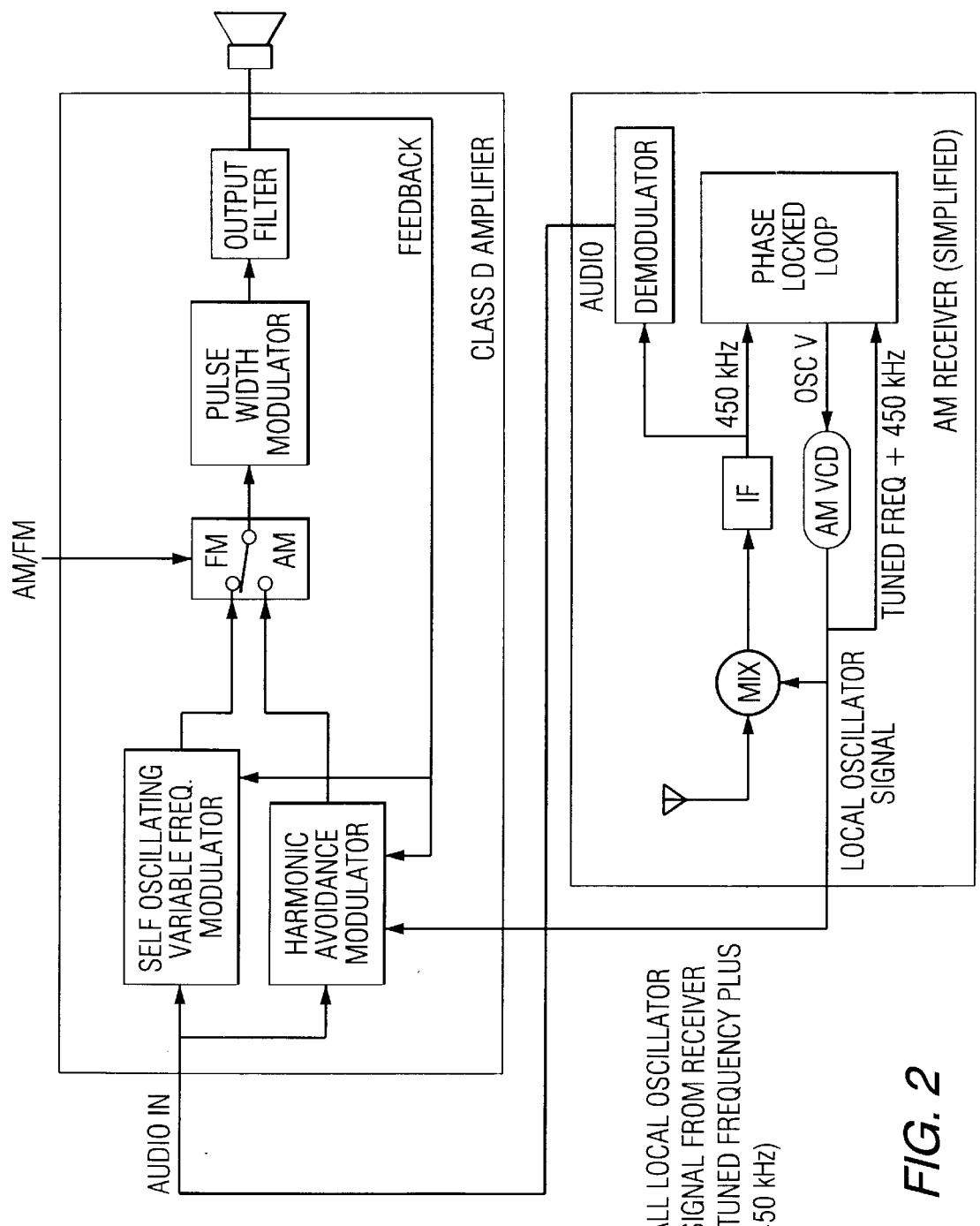
FIG. 2 is a schematic diagram of a dual mode harmonic avoidance class D amplifier.

FIG. 2 shows one solution that includes a harmonic avoidance amplifier. The local oscillator signal for an AM receiver is 450 KHz above the selected receive frequency. This signal provides the information necessary for the harmonic avoidance circuit to know what frequency to avoid. It also provides a frequency standard to which to synchronize multiple amplifiers to prevent intermodulation of individual amplifier clocks that could produce interference at the selected frequency.

This amplifier solves the AM interference issue by preventing co-location of clock harmonics with the receiver-selected frequency. FM interference can be solved with appropriate filtering, shielding, and soft switching techniques. This technique allows full power; operation for both AM and FM receptions with only a minor degradation of audio performance in AM reception associated with the fixed frequency modulator in AM compatibility mode. The concept of dual mode operation is not limited to this specific example. Dual mode operation can involve other techniques which control the harmonics generated by the switching amplifier or other amplification technology when receiving AM signals. AM interference is the primary concern. Otherwise, audio fidelity is the primary design goal.

Combined Class D/AB Amplifier

Figure 3:
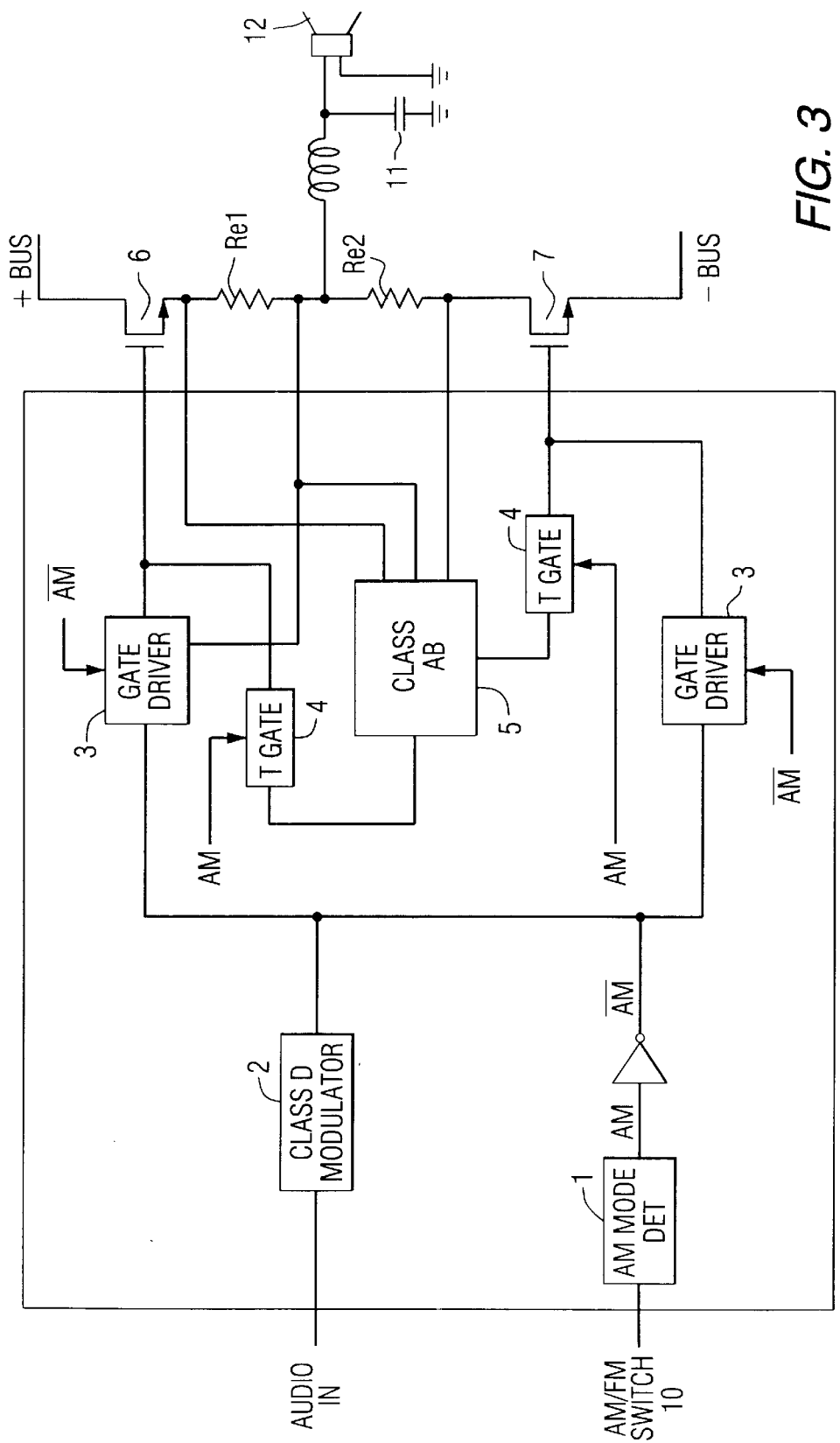
FIG. 3 is a schematic diagram of a dual mode combined class D/AB amplifier.

FIG. 3 shows one possible solution for a dual mode amplifier. When in AM mode, the two MOSFETS are controlled as a class AB amplifier. Otherwise, the amplifier operates as a class D amplifier.

The AM /FM switch 10 sets the mode of operation. The AM mode detector block, 1, generates a logic signal depending on the switch. If AM-compatibility mode is engaged, then the amplifier operates as a class AB amplifier. The AM logic signal is applied to the two transmission gates, 4, so that the class AB amplifier is connected directly to the gates of the MOSFETS. Meanwhile, the inverted AM signal tri-states both gate drivers. Sensing the voltage drop across the two resistors, Re1 and Re2, provides current limit protection. When AM-compatibility mode is not engaged, the amplifier operates as a class D amplifier. The two transmission gates are open disconnecting the class AB from the gates. The inverted AM signal enables both gate drivers.

This amplifier solves the AM interference issue by operating as a class AB amplifier while in AM-compatibility mode. FM interference can be solved with appropriate filtering, shielding, and soft switching techniques. While the peak power is the same for both modes of operation, AM mode is limited by the poor efficiency of class AB amplifiers.

The concept of dual mode operation is not limited to the specific example. In theory it can be extended to cover class A and class B linear amplifiers. Furthermore, dual mode operation can involve other techniques that control the harmonics generated by the switching amplifier itself. This would allow the amplifier to switch between two high efficiency modes. In AM mode, AM interference is the primary concern. Otherwise, audio fidelity is the primary design goal.

Analog Comparators

Figure 4:
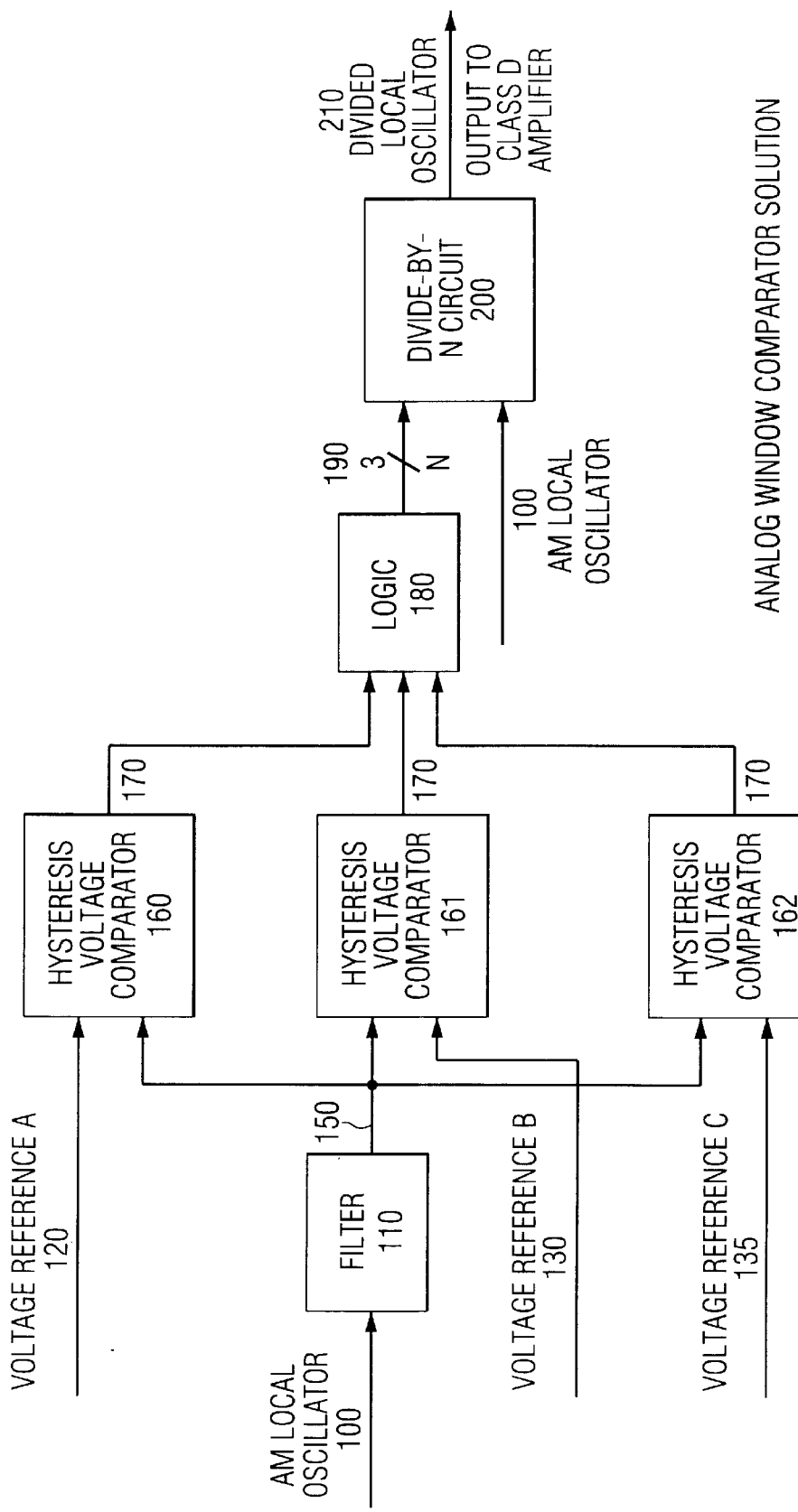
FIG. 4 is a block diagram of a method for using the AM local oscillator as a clock source for a class D amplifier.

A method for using the AM local oscillator (LO) as a clock source for a class D amplifier is shown in FIG. 4. The local oscillator signal 100 is fed through a filter 110 that may be either an active or passive circuit. As long as the time constant for the filter is long enough, variations in the input local oscillator frequency will result in a nearly-DC, very slowly changing output voltage 150 from the filter. The magnitude of the output voltage varies with the frequency of the input AM local oscillator voltage: the higher the input frequency, the higher the output voltage and vice versa. The output voltage is fed to three analog hysteresis voltage comparator circuits 160,161,162. The hysteresis characteristic keeps the comparators from rapidly changing state and thus stabilizes the comparator outputs. Each comparator has a different reference voltage 120, 130, or 135 as its comparison point. The reference voltages are found using a predetermined algorithm that determines the optimal points within the AM band at which to switch from one value of N to another. The optimal points are based on the resultant switching frequency's proximity to the tuned radio station, the maximum desired switching frequencies (due to efficiency considerations), the minimum desired switching frequencies (based on audio frequency filtering considerations), and the frequency of the local oscillator (450 or 455 kHz). Those skilled in the art understand that the range of frequencies covered by the comparators and the algorithm varies with the range of the input AM frequencies and the frequency of the local oscillator.

Combinational logic 180 considers the states of the three analog comparators and generates a three-bit value for N 190. N is a three bit binary input to a digital divide-by-N circuit. Those skilled in the art understand that the combinational logic block 180 can be designed with many different logic devices including AND, NAND, OR, and NOR gates.

A divide-by-N circuit 200 divides the frequency of LO input 100 by N 190. The divided-down LO 210 is the resultant output. Those skilled in the art understand that the divide-by-N circuit can be created in many different ways, including using integrated circuit divide-by-N logic devices, other off-the-shelf logic products, or gate-level designs. The divided-down LO 210 is a fixed frequency square wave dependent upon the frequency of the LO 100. The divided-down LO 210 is used to control the frequency of an attached class D amplifier.

Here is an example of how the circuit and method works to provide a class D oscillator signal that does not interfere with an input AM signal. Assume the AM oscillator is at a frequency of 1200 kHz. The filter 110 is a passive circuit comprising a capacitor and resistors. It converts the 1200 kHz signal in to a 4 volt dc signal. The reference voltage signals are 6 volts for reference A, 3 volts for reference B, and 1 volt for reference C. The comparators 160, 161, 162 are hysteresis comparators. They output a binary signal of "1" when input signal is greater than the reference signal or "0" when the input signal is less than the reference signal. Here the outputs are, respectively, 0, 1, 1. The logic circuit 180 converts the binary output signals into a binary number for dividing the input frequency. A truth table of the possible binary output signals looks as follows:

| A | B | C | N(decimal) |
|---|---|---|---|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

The combinational logic, as just described, converts the results of the comparator signals into a decimal number. Suitable logic provides an output integer divisor signal that is greater than 1 and less than 8. The input frequency is divided by the divisor to generate a class D oscillator signal that does not interfere with the AM signal. Here the 011 results in a divisor of 3 and the input frequency is divided from 1200 kHz to 400 kHz.

Those skilled in the art understand that the combinational logic circuit can be configured to provided different divisors depending upon the range of input frequencies. The comparator outputs may be combined with AND, OR, NOR or XNOR logic gates to achieve practical results. The above example is presented merely to show a simple logic circuit.

Digital Comparators

Figure 5:
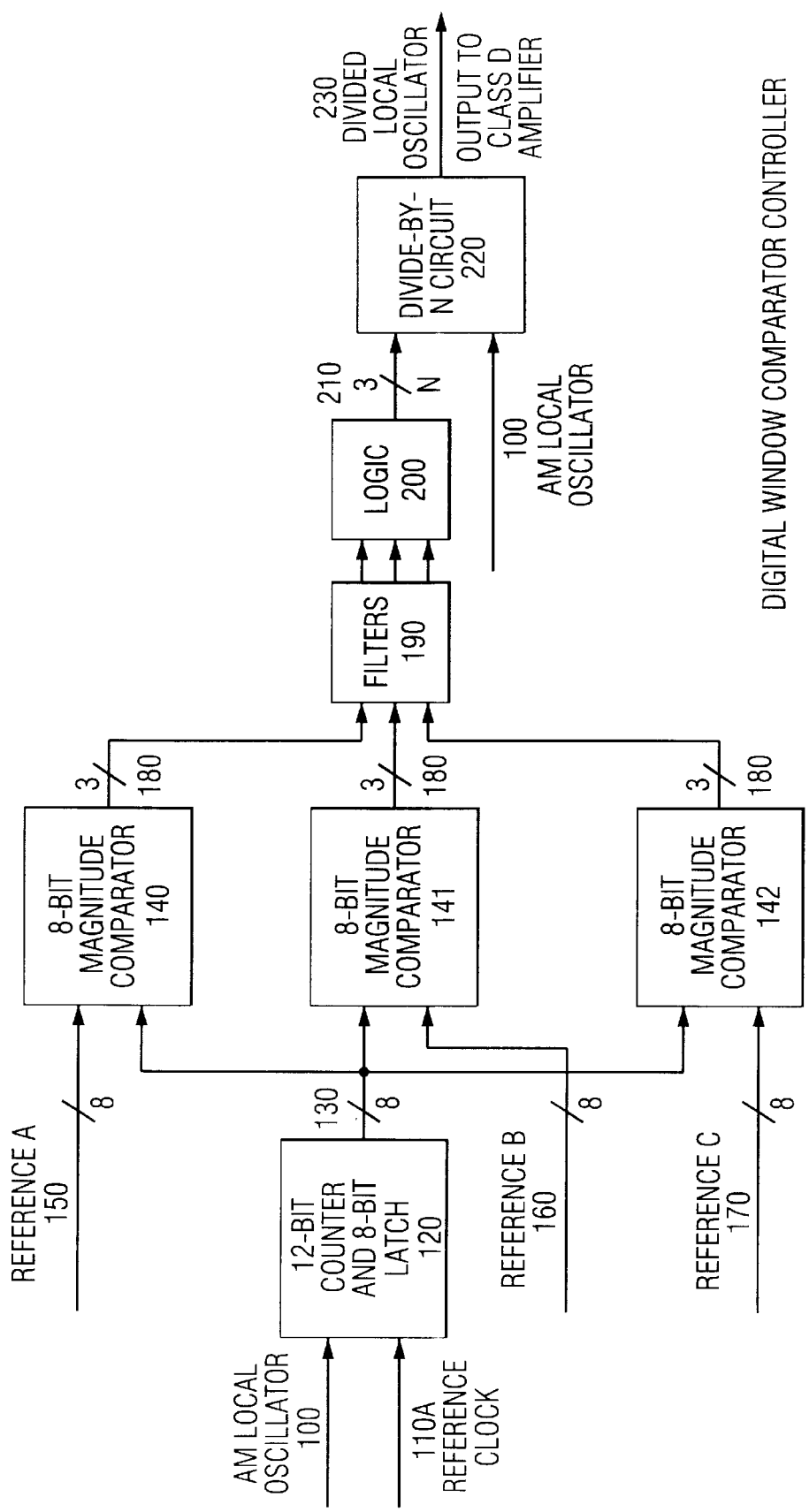
FIG. 5 is a block diagram of a method for using the AM local oscillator as a clock source for a class D amplifier.

A method for using the AM local oscillator (LO) as a clock source for a class D amplifier is shown in FIG. 5. A square wave LO 100, along with a low-frequency reference clock frequency 110, serve as inputs to a twelve bit counter and latch circuit 120. (If the AM tuner's LO is not a square wave, those skilled in the art can understand that a simple analog circuit can be constructed to convert it to a square wave.) The twelve bit counter accumulates pulses from the LO during the period of the much slower reference clock. When the reference clock period ends, the most significant eight bits of the counter are latched to the output of the module 120. The least significant four bits of the counter output are discarded as they serve only to help filter the counter value.

The eight bit latched counter value 130 serves as an input to three digital magnitude comparators 140–142. The magnitude comparators compare three different reference values 150, 160, 170 to the latched counter value 130. Those skilled in the art understand that the magnitude comparators can be made many different ways. One possible way is to cascade two type 7485 digital four bit comparators for each eight bit comparator. It is also desirable to have hysteresis built into each comparator to prevent noise at boundary conditions from causing any instability in the comparators' 140–142 outputs.

The reference values 150, 160, and 170 correspond to frequencies at which the value of N should change. The reference values are determined based on a special algorithm and the ratio of the local oscillator frequency 100 to the reference clock frequency 110. N can be an integer between the values of three and six inclusive. Each eight bit magnitude comparator has three outputs 180 that indicate whether the reference value 150, 160, or 170 is less than, equal to, or greater than the latched counter value 130. All three comparators' three outputs 180 serve as inputs to a filter circuit 190 which feeds combinational logic 200 that sets a three bit value of N 210 based on the comparators' filtered outputs. Those skilled in the art understand that the combinational logic block 200 and filter circuit 190 can be designed with many different logic devices including AND, NAND, OR, and NOR gates.

A divide-by-N circuit 220 takes the value of N 210 and the square wave LO input 100 and divides the LO input 100 by N 210. The divided-down LO 230 is the output from the divide-by-N circuit 210. Those skilled in the art understand that the divide-by-N circuit can be created in many different ways, including using integrated circuit divide-by-N logic devices, other off-the-shelf logic products, or gate-level designs. The divided-down LO 230 is a fixed frequency square wave dependent upon the frequency of the LO 100. The divided-down LO 220 is used to control the frequency of an attached class D amplifier.

Here is an example of how the circuit and method works to provide a class D oscillator signal that does not interfere with an input AM signal. Assume the AM oscillator is at a frequency of 1200 kHz. The 12 bit counter 120 counts pulses from the AM local oscillator 100 over a fixed time period. The most significant eight bits of the count tally are periodically latched to the output 130 of the counter and latch 120. Assume that the output of the counter and latch 120 is "200." The "200" is latched as the eight most significant bits to provide an input signal to the three comparators 140, 141, 142. Each comparator stores or receives a reference number, A, B, and C, respectively. The reference numbers correspond to frequency breakpoints for AM signals in the 980–2160 kHz range of input local oscillator signals. For example, reference A might be "220", reference B is "150" and reference C is "100". The comparators 140–142 output a two bit binary signal representative of whether the input is greater than, less than or equal to the reference number. For example, the comparators have a binary output of "010" when the input signal is greater than the reference signal, "001" when the input signal is less than the reference signal, and "100" when the input equals the reference. The logic circuit 180 converts the binary output signals of the comparators into a binary number for dividing the input frequency.

The differences between the reference numbers are chosen to correspond to a desired range of frequencies. For example, a number greater than A may correspond to a frequency above 1800 kHz; between A and B may correspond to 1500–1800 kHz; 1200–1500 corresponds to a number between B and C and any number less than C corresponds to a frequency less than 1200 kHz. Such a choice establishes the algorithm for selecting the number N that divides the AM local oscillator frequency. For example, a frequency in the range of less than 1200 kHz will be divided by 3 to keep the resulting switching frequency far away from 450 kHz or any harmonics thereof.

The combinational logic converts the results of the comparator signals into a decimal number. Suitable logic provides an output integer divisor signal that is greater than 1 and less than 8. The input frequency is divided by the divisor to generate a class D oscillator signal that does not interfere with the AM signal. Here the 011 results in a divisor or 3 and the input frequency is divided from 1200 kHz to 400 kHz.

Those skilled in the art understand that the combinational logic circuit can be configured to provided different divisors depending upon the range of input frequencies. The comparator outputs may be combined with AND, OR, NOR or XNOR logic gates to achieve practical results. The above example is presented merely to show a simple logic circuit.

Two Loop Comparator

Figure 6:
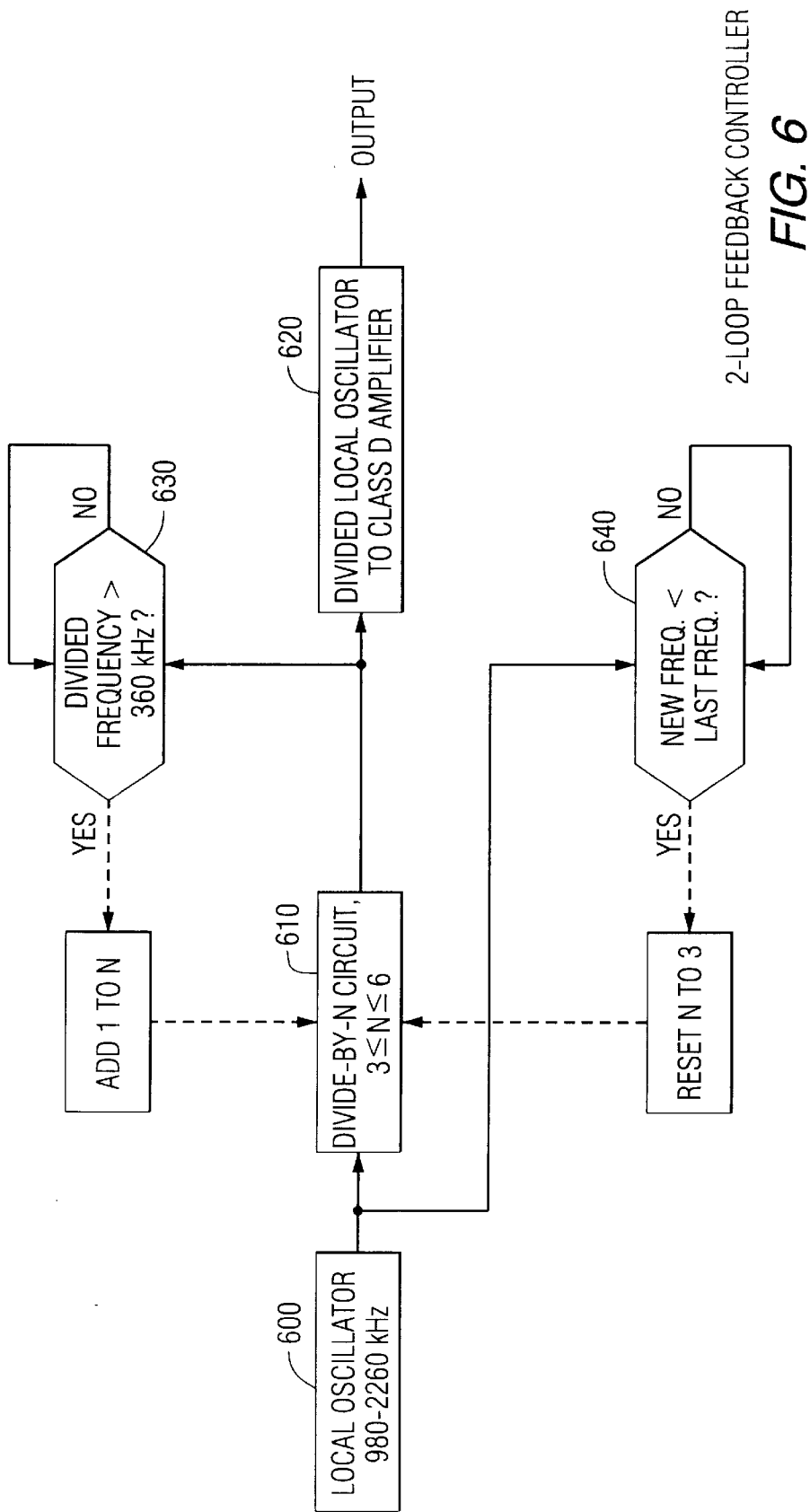
FIG. 6 is a block diagram of an algorithm for dividing the AM local oscillator down to a frequency usable by a suitable class D amplifier.

FIG. 6 shows an AM radio local oscillator (LO) signal 600 that is input to the algorithm. It passes through a divide-by-N circuit that divides the frequency of the LO by the integer value N where N is between the values of 3 and 6 inclusively. The divided-down local oscillator 620 is the output from the circuit. Those skilled in the art understand that the divide-by-N circuit can be created in many different ways, including using integrated circuit divide-by-N logic devices, other off-the-shelf logic products, or gate-level designs. The divided-down LO 620 is a fixed frequency square wave dependent upon the frequency of the LO 600. The divided-down LO 620 is used to control the frequency of an attached class D amplifier.

The value of N is determined by two frequency comparator circuits operating as feedback controllers. One comparator 630 compares the divided down LO with a maximum frequency "ceiling" that has been predetermined based on a desired maximum operating frequency and the amount of separation between switching harmonics and tuned radio stations that the ceiling provides. If the divided down LO frequency is above that ceiling, the value of N is increased. By increasing N, the frequency of the divided down LO will decrease. The ceiling comparator 630 will keep increasing N until the divided down LO is at or below the frequency ceiling. When the divided down LO falls below the frequency ceiling, the ceiling comparator 630 no longer increases N. As long as the frequency ceiling is properly chosen, N will be at its maximum value of six when the local oscillator is at its maximum frequency of 2260 kHz. The frequency ceiling for one particular class D amplifier is 360 kHz. 360 kHz provides for the best possible switching harmonic separation from the tuned radio station while keeping switching suitable for at least one particular class D amplifier design.

The just-described feedback loop only increments N. If the user of the AM radio is tuning down the AM band and there was no mechanism to decrease the value of N, the divided-E-down LO would drop to such a low frequency that the attached class D amplifier would be switching too slowly for its output filters to adequately remove the switching frequency and its harmonics from its output. In addition, N would not be at its correct value for avoiding AM radio interference. Therefore, a mechanism for resetting N to its lowest value of three has been devised. The feedback loop 640 that resets N runs in parallel with the ceiling comparator 630 feedback loop.

The N-reset feedback loop 640 stores a recent LO frequency value in a memory such as a digital counter. The loop compares the current LO frequency to the one stored in its memory. If the new frequency is lower than the old frequency, the user is tuning the AM radio from a higher to a lower frequency station. Such a change will reset N to its lowest value of three. If that value of N is then too low for the newly tuned station, the ceiling comparator will detect that problem and increase N appropriately.

Multiple Clocks

Figure 7:
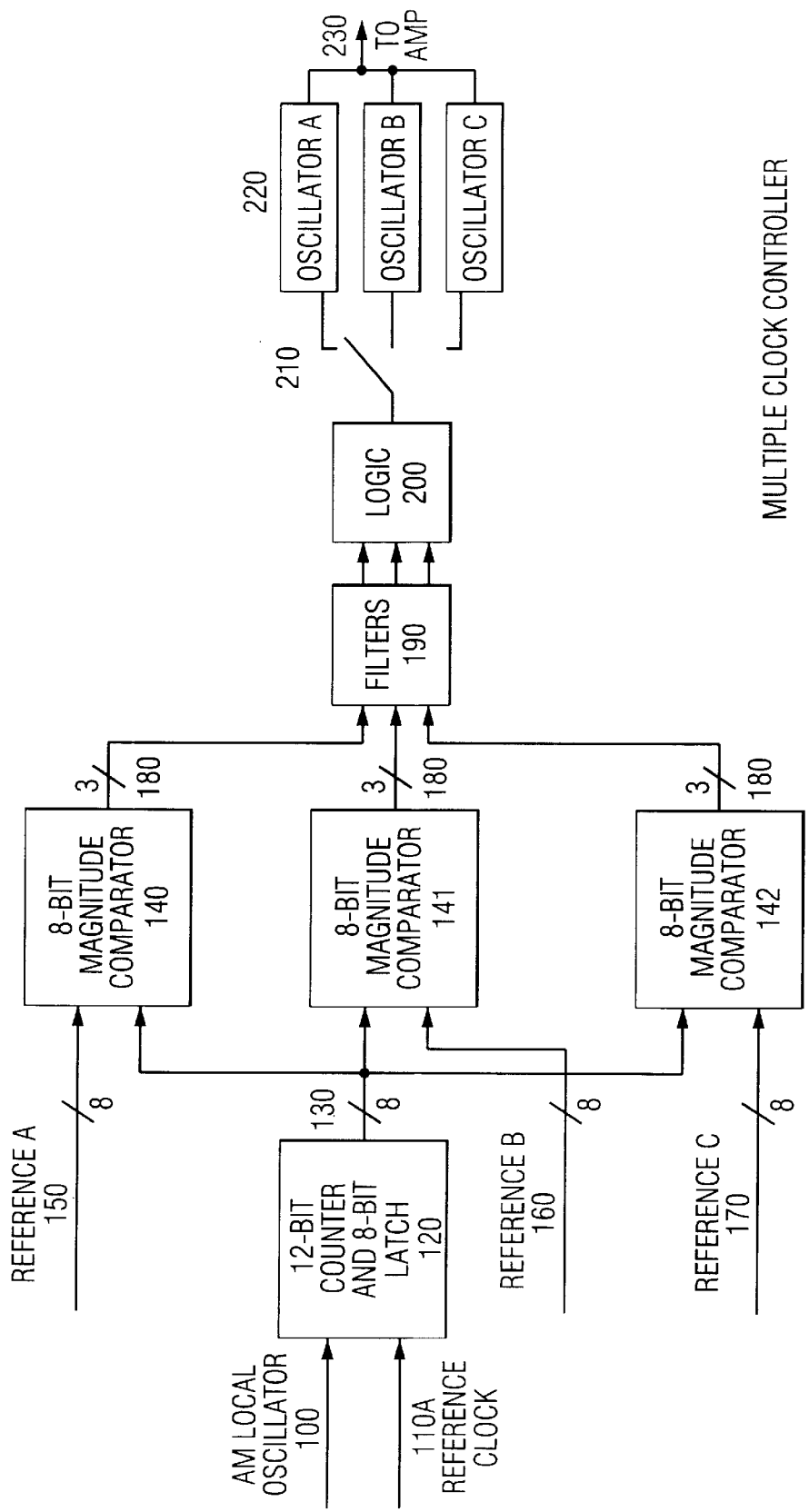
FIG. 7 is a block diagram of a method for using the AM local oscillator as a reference for making intelligent control decisions about the switching frequency of a class D amplifier that does not interfere with a nearby AM radio.

A method for using the AM local oscillator (LO) as a determinant of clock frequency for a class D amplifier controller is shown in FIG. 7. A square wave LO 100, along with a low-frequency reference clock 110, serve as inputs to a twelve bit counter and latch circuit 120. (If the AM tuner's LO is not a square wave, those skilled in the art understand that a simple circuit can be constructed to convert it to a square wave.) The twelve bit counter accumulates pulses from the LO during the period of the much slower reference clock. When the reference clock period ends, the most significant eight bits of the counter are latched to the output of the module 120. The least significant four bits of the counter output are discarded as they serve only to help filter the counter value.

The eight bit latched counter value 130 serves as an input to three digital magnitude comparators 140–142. The magnitude comparators 140–142 compare three different reference values 150, 160, 170 to the latched counter value 130. Those skilled in the art understand that the magnitude comparators 140–142 can be made many different ways. One possible way is to cascade two type 7485 digital four bit comparators for each eight bit comparator 140–142. It is desirable to have hysteresis built into each comparator, or use filtering 190 after the counters, to prevent noise at count values near window comparator transition points from causing any instability in the comparators' 140–142 outputs.

The reference values 150, 160, and 170 correspond to frequencies at which the controller should toggle between different oscillator frequencies . The reference values are determined based on a special algorithm and the ratio of the local oscillator frequency 100 to the reference clock frequency 110.

The logic block 200 is used to determine which external oscillator 220 should be activated by electronic switch 210. If the output oscillator 220 frequencies are correctly picked and the reference frequencies 150 at which they are engaged are properly chosen, the resultant output frequency 230 that is driving the class D amplifier will always produce a switching frequency and harmonics that avoid the tuned AM radio station.

Other Applications

Those skilled in the art will appreciate that the invention may be applied to any switching amplifier where harmonics are a problem. For example, the invention is useful in power supplies. As the demand for more efficient power supplies increases, switching amplifiers are leading candidates for the most efficient power supply. The structure and operation of a switching power supply are substantially the same as a class D audio amplifier. Likewise, switching amplifiers generate unwanted AM harmonics. The invention can be readily incorporated into switching power supplies to solve the problem of unwanted AM harmonics.

Having thus described the preferred embodiments and applications of the invention, those skilled in the art will understand that further additions, changes and modifications may be made to the invention without departing from the spirit and scope as set forth in the following claims.

What is claimed is:

1. A circuit for avoiding AM radio interference in a class D amplifier, said class D amplifier having a switching frequency, said circuit comprising:

means for comparing a first signal representative of the frequency of an AM signal to one or more reference signals representative of different frequencies;

means for generating comparator signals representative of whether the first signal is greater than or less than or equal to the reference signals;

means for generating a frequency divisor number, said frequency divisor number dependent at least in part upon the comparator signals;

means for modifying said switching frequency, said means dividing the frequency of the AM signal by the frequency divisor signal to derive a modified switching frequency; and a counter measuring the frequency of the AM signal and generating a digital signal representative of the AM frequency, said reference signals comprising digital reference signals.

2. A circuit for avoiding AM radio interference in a class D amplifier, said class D amplifier having a switching frequency, comprising:

a counter and latch for receiving an input oscillator signal and for generating an output digital signal proportional to the frequency of the input oscillator signal;

a plurality of comparators for comparing the digital signal to reference digital signals and generating comparator output signals representative of whether the output digital signal proportional to the frequency is greater than or less than or equal to the reference digital signals;

a combinational logic circuit for combining the comparator output signals to generate a frequency divisor signal; and a divider circuit for dividing the frequency of the AM signal by the frequency divisor signal to generate said switching frequency for the class D amplifier.

* * * * *